OSCILLATOR WITH LOW DISTORTION FEEDBACK GAIN CONTROL

Filed April 14, 1967 2 Sheets-Sheet 1

INVENTOR.
WALTER T. TOWNER
BY Arnold & Roylance
ATTORNEYS

INVENTOR.
WALTER T. TOWNER
BY
Arnold, Roylance, Kruger & Durkee
ATTORNEYS

United States Patent Office 3,378,791
Patented Apr. 16, 1968

3,378,791
OSCILLATOR WITH LOW DISTORTION FEEDBACK GAIN CONTROL

Walter T. Towner, Canton, Mass., assignor to Weston Instruments, Inc., Newark, N.J., a corporation of Delaware Continuation-in-part of application Ser. No. 592,523, Nov. 7, 1966. This application Apr. 14, 1967, Ser. No. 633,350
9 Claims. (Cl. 331—183)

ABSTRACT OF THE DISCLOSURE

An oscillator including a main amplifier and a linear modulator for amplitude control is provided with a distortion reducing network connected between the modulator and an input to the main amplifier. In one embodiment the network includes a coupling capacitor, a resistor and an inverting operational amplifier connected in series. In a second embodiment the network includes a coupling capacitor and series and shunt resistors, and the input stage to the main amplifier is a differential amplifier stage.

This application is a continuation in part of application Ser. No. 592,523, filed Nov. 7, 1966, by Walter T. Towner and now abandoned.

This invention relates to oscillator systems having an amplifier, a feedback network connected between the input and output terminals of the amplifier, and a feedback gain control system, and more specifically to such an oscillator system wherein the feedback system includes means for minimizing control signal distortion.

In the oscillator art it is well known to provide an amplifier with a positive feedback network which modifies the amplifier output signal in an appropriate way and connects that signal to the input terminal of the amplifier to sustain oscillations. Many such networks are known, including feedback networks having active as well as passive circuit elements.

In copending application Ser. No. 569,222, filed Aug. 1, 1966, in the name of John G. Nordahl, is described a novel oscillator system using an active network which can be characterized as a linear modulator. In that system, an impedance is connected in the feedback network to alternate the amplitude of the AC signal being fed back. The impedance is variable in magnitude and is controlled by a DC control voltage. The control voltage applied to the variable impedance is derived from the AC output signal so that close control of the amplitude of the feedback signal, and therefore of the system output signal, is obtained.

It is possible in the above described system for distortion to be introduced by ripple being fed through the linear modulator to the input of the main oscillator amplifier in addition to the desired feedback. This distortion, when present, diminishes the accuracy of the control function of the system, and therefore of the precision of the oscillation amplitude value.

An object of the present invention is to provide an oscillator system having variable impedance feedback circuit means for providing a controlled amplitude AC output signal and circuit means for reducing distortion in the amplitude control system.

Another object is to provide a distortion reducing network for removing the unwanted ripple resulting from a variable resistance linear modulator circuit in an oscillator system.

Briefly stated, the present invention is based on recognition of the presence, in a linear modulator variable impedance circuit, of a signal a component of which corresponds to an undesirable ripple voltage coupled to the input of the oscillator amplifier. In accordance with the invention the ripple component is isolated and inverted and is summed with the total signal input to the oscillator in inverse phase relationship. The unwanted ripple is thereby cancelled and the distortion resulting from that ripple is removed.

In order that the manner in which the foregoing and other objects are attained in accordance with the invention can be understood in detail, particularly advantageous embodiments thereof will be described with reference to the accompanying drawings, which form a part of this specification, and wherein.

Figure 1:
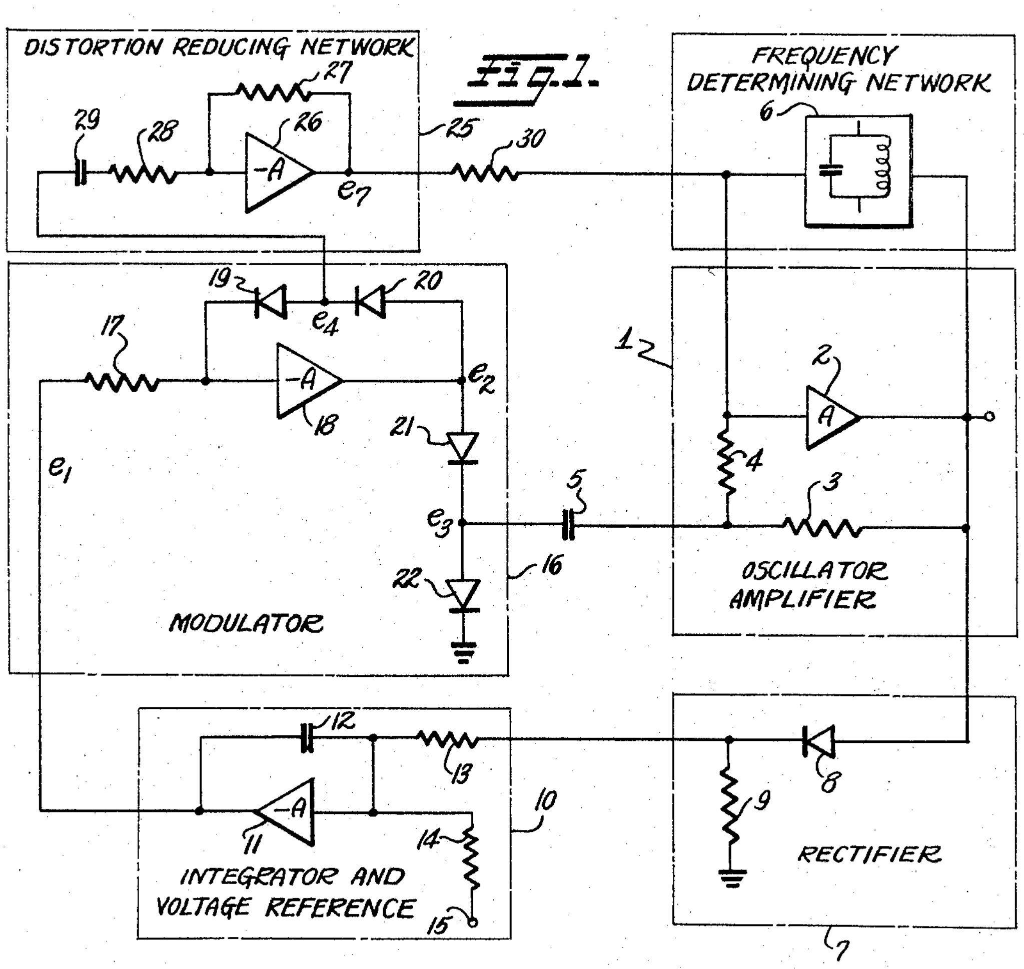
FIG. 1 is a schematic diagram, partly in block form of one embodiment of an oscillator system incorporating the invention.

FIG. 1 shows a complete oscillator system including an oscillator amplifier 1 which comprises a conventional amplifier 2 and a feedback circuit including fixed resistors 3 and 4 connected in series circuit relationship between the input and output terminal of amplifier 2. The junction between resistors 3 and 4 is connected to one terminal of a fixed coupling capacitor 5. The input and output terminals of amplifier 2 are also connected to the terminals of a frequency determining network 6 which establishes the frequency at which oscillator 1 will oscillate. Network 6 is symbolically shown as including a resonant tank circuit with capacitance and reactance. It will be recognized, however, that circuit 6 can contain any conventional frequency predetermining means such as any of the many well-known reactance circuit configurations or resonant crystals, for example. For extremely stable operations, unit 6 can include one of the more accurate frequency establishing networks such as an oven-controlled or temperature compensated resonant crystal.

The output terminal of amplifier 2 is also connected to a rectifier network 7 which includes a conventional semiconductor diode 8. The output terminal of amplifier 2 is connected to the anode electrode of diode 8, the cathode electrode of which is connected to one terminal of a fixed resistor 9, the other terminal of which is connected to ground. The cathode electrode of diode 8 is also connected to the input of an integrator and voltage reference circuit 10. Circuit 10 includes an amplifier 11 and a capacitor 12, the capacitor being connected between the input and output terminals of the amplifier forming an operational integrator circuit. The input terminal of amplifier 11 is also connected to the output of circuit 7 via a fixed resistor 13, and to one terminal of a fixed resistor 14, the other terminal of which is connected to a terminal 15 which is connected, in operation, to a source of DC reference potential.

The output of unit 10 is connected to the input of a linear modulator circuit 16, the output of circuit 10 being coupled through a fixed input resistor 17 to the input terminal of a high gain inverting amplifier 18. Conventional semiconductor diodes 19 and 20 are connected in series circuit relationship between the input and output terminals of amplifier 18, the cathode electrodes of both diodes being connected nearest the input terminal of the amplifier. Also, conventional semi-conductor diodes 21 and 22 are connected in series circuit relationship between the output terminal of amplifier 18 and a point of reference potential, shown in FIG. 1. as ground. The junction between diodes 21 and 22 is connected to the remaining terminal of capacitor 5, the other terminal of which is connected to the feedback circuit in the oscillator amplifier.

The junction between diodes 19 and 20 is connected to the input of a distortion reducing network 25 which includes a high gain inverting amplifier 26 and a fixed resistor 27 connected between the input and output terminals of amplifier 26, thereby forming an operational amplifier. A fixed resistor 28 is connected in series circuit relationship with the capacitor 29 between the input terminal of amplifier 26 and the junction between diodes 19 and 20.

The output terminal of amplifier 26 is connected to one terminal of a fixed resistor 30, the other terminal of which is connected to the frequency determining network and to the input terminal of oscillator amplifier 2.

The operation of modulator 16, together with rectifier 7 and integrator 10, to control the amplitude of the oscillations generated at the output of amplifier 2 is fully described in the copending Nordahl application referred to above. A brief description of this operation is included here for convenience. Rectifier 7 accepts the AC output of amplifier 2 at the anode of rectifier 8 and provides a unidirectional signal to integrator circuit 10 which integrates that half-wave rectified signal and compares it to the DC voltage provided at terminal 15 to produce a relatively well-rectified but pulsating DC signal, proportional to the oscillation amplitude, to the input of modulator 16. This input voltage generates a current into amplifier 18 which is amplified and which produces a current through a series circuit including diodes 21 and 22 between the output of amplifier 18 and ground. Amplifier 18, being a very high gain amplifier and being provided wtih the feedback circuit of diodes 19 and 20, performs as an operational amplifier, the input terminal to amplifier 18 acting as a summing junction which remains at substantially ground potential. Thus, the current flowing through diodes 19 and 20 is of substantially the same magnitude as that flowing through diodes 21 and 22. The input to amplifier 18 is then necessarily the difference in current between that provided by the feedback circuit and that produced through input resistor 17. Thus the current through diodes 21 and 22 is directly proportional to changes in the DC control voltage provided to resistor 17. The resistance across a diode being inversely proportional to the current flowing through that diode, the resistance across diode 22 will also be a direct function of the control voltage supplied to resistor 17, this resistance being effective as an AC resistance through coupling capacitor 5 to change the resistance of the feedback circuit in the oscillator amplifier circuit. This variable impedance controls the level of feedback current in the oscillator amplifier and thus controls the amplitude of the oscillations generated therein.

The difficulty arises because of the imperfect filtering action of integrator and voltage reference circuit 10. Although it would be possible to provide complete filtering action in a complex circuit substituted for unit 10, this circuit would be highly expensive and cumbersome, and would also necessarily have a substantially poorer response and would therefore diminish the effectiveness of the control function. Nevertheless, it is necessary that the pulsations or ripple be eliminated because it is coupled through capacitor 5 through the feedback circuit of amplifier 1 and is combined with the oscillations produced thereby, leading to distortion.

At this point it will be helpful to identify voltages which appear at several points throughout the system of FIG. 1 for assistance in a more detailed description of the operation of the system. The ripple component of the controlled voltage 17 is identified as $e_1$. The ripple component of the voltage appearing between diodes 19 and 20 in the feedback circuit around amplifier 18 is identified as $e_4$. The ripple voltage appearing at the output of amplifier 18 is $e_2$, and the ripple voltage appearing at the junction between diodes 21 and 22 is $e_3$. The ripple component appearing at the output of amplifier 26 in the distortion reducing network is identified as $e_7$.

Without entering into a detailed analysis of the relationship between these voltages, it will be recognized that $e_3$ is that unwanted component which is coupled into the oscillator amplifier, and that the function of the distortion reducing network is to eliminate that voltage. It will also be recognized that, if the proper impedance relationships are maintained, voltage $e_4$, because it is in a network symmetrical with that in which $e_3$ exists, will be equal to $e_3$. Thus, the function of the distortion reducing network is to produce a voltage $e_7$ which will be opposite in polarity to, and equal in magnitude to, $e_3$.

Figure 2:
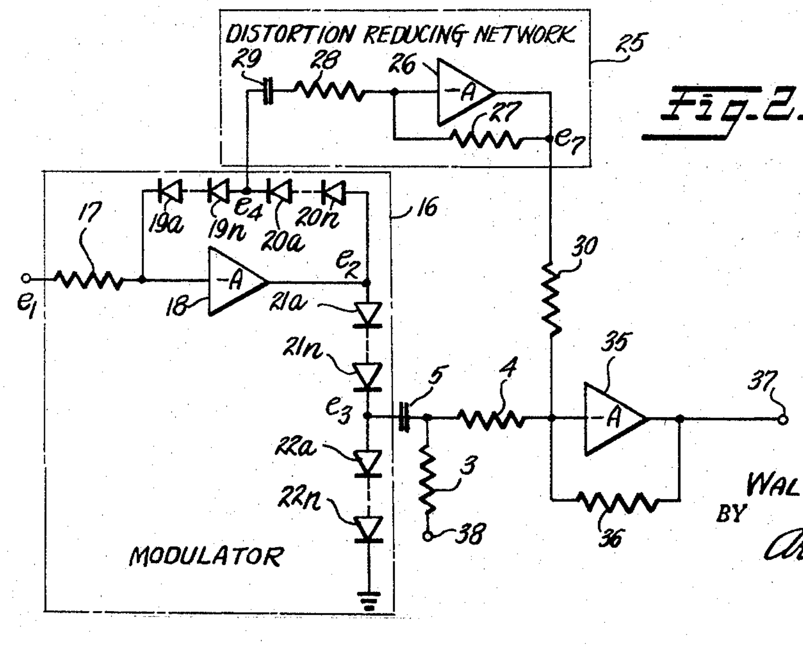
FIG. 2 is a schematic diagram, partly in block form of a portion of the system of FIG. 1.

For a more complete discussion of this operation, refer now to FIG. 2 which shows, in greater detail, modulator 16, distortion reducing network 25, and a portion of the oscillator amplifier with the interconnecting circuitry. Like identifying numerals have been used to correlate like components in FIG. 1 and FIG. 2, the distortion reducing network including inverting amplifier 26, feedback resistor 27, input resistor 28, and coupling capacitor 29. Also, modulator 16 includes amplifier 18 and input resistor 17. It will be noted that the feedback network for amplifier 18 includes a plurality of diodes **19*a*–19*n* and 20*a*–20*n*. As described in the copending Nordahl application, any number of diodes can effectively be used in the feedback network, the existence of additional diodes being indicated by the dotted lines between adjacent diodes 19*a* and 19*n*. Also, the series diode circuit between the output terminal of amplifier 18 and ground is seen to include diodes 21*a*–21*n* and 22*a*–22*n*, the optional existence of other diodes between these being shown by the dotted lines in FIG. 2. Also as described in the Nordahl application, the important feature in the numbers of diodes in these circuits is that the series circuit between the output of amplifier 18 and ground, for optimum operation, includes the same number of diodes as in the feedback circuit between the input and output terminals of amplifier 18. The junction at which $e_3$ appears is most advantageously placed at the midpoint of the series circuit including diodes 21*a–n* and 22*a–n***, and the junction at which voltage $e_4$ appears is at the midpoint of the feedback circuit, regardless of numbers of diodes in each circuit.

As in FIG. 1, coupling capacitor 5 couples voltage $e_3$ from the series diode circuit to the oscillator amplifier feedback circuit at the junction of resistors 3 and 4, and resistor 30 couples the output of the distortion reducing network from the output of amplifier 26 to the input of the oscillator amplifier. The illustration of FIG. 2 differs from that of FIG. 1 in the oscillator amplifier, in that resistors 30 and 4 are shown connected to the input terminal of only a portion of the oscillator amplifier shown as an inverting amplifier 35. A feedback resistor 36 is connected between the input and output terminals of amplifier 35, the output of amplifier 35 being connected to the remaining portion of the oscillator amplifier, which is connected to an output terminal 37. The feedback signal from the remaining portion of the oscillator amplifier is then connected to terminal 38 shown at one end of resistor 3. Amplifier 35, with its feedback resistor 36, are shown to emphasise the fact that the input stage of the oscillator amplifier is advantageously an operational amplifier, and that resistors 30, 4 and 36 are joined to form a summing junction at the input to amplifier 35.

In analyzing the elimination of the unwanted ripple voltage, it will be recognized that the ripple voltage $e_2$ is equal to the ripple component $e_1$ times the ratio of the effective DC feedback resistance across amplifier 18 divided by the value of input resistor 17. This is true where the effective AC feedback resistance includes the impedance presented by the number of diodes in the feedback circuit together with the impedance presented by resistor $R_6$ connected at the center of the feedback string. The amount of ripple appearing at $e_3$ is determined by the voltage divider.

(1) $$\frac{e_2(R_4R_3)}{R_k(R_4+R_3)+2R_4R_3}$$

which can also be expressed as (2) $$\frac{\frac{e_2}{2}\frac{(R_3R_4)}{(R_3+R_4)}}{\frac{R_3R_4}{R_3+R_4}+\frac{R_k}{2}}$$

where $R_3$ and $R_4$ are the values of resistors 3 and 4, $R_k$ is equal to the resistance of $k$ diodes under predetermined conditions of bias, and where the capacitor 5 is sufficiently large so that (3) $$X_{c5} \ll \frac{R_3R_4}{R_3+R_4}$$

Recognizing that the resistance value of the diodes will vary with the magnitude of the DC controlled voltage, it will be seen that the amount of ripple voltage $e_3$ will also vary. The ripple voltage at $e_4$ will be equal to (4) $$\frac{e_2R_{28}}{R_k+2R_{28}}$$

where $X_{c29} \ll R_{28}$.

Setting Equations 3 and 4 equal to each other, it will be seen that the ripple voltage at $e_4$ can be made equal to that at $e_3$ if (5) $$R_{28}=\frac{R_3R_4}{R_3+R_4}$$

This equality is seen to be independent of the diode resistance value $R_k$, so that the equality is true regardless of the variation in DC control voltage. The $e_4$ ripple signal is then inverted, as discussed above, through amplifier 26 and summed through resistor 30 so that it cancels the $e_3$ ripple voltage which is summed through resistor 4. The net AC signal appearing at the output of amplifier 35 therefore has no signal component resulting from the ripple at $e_1$.

Figure 3:
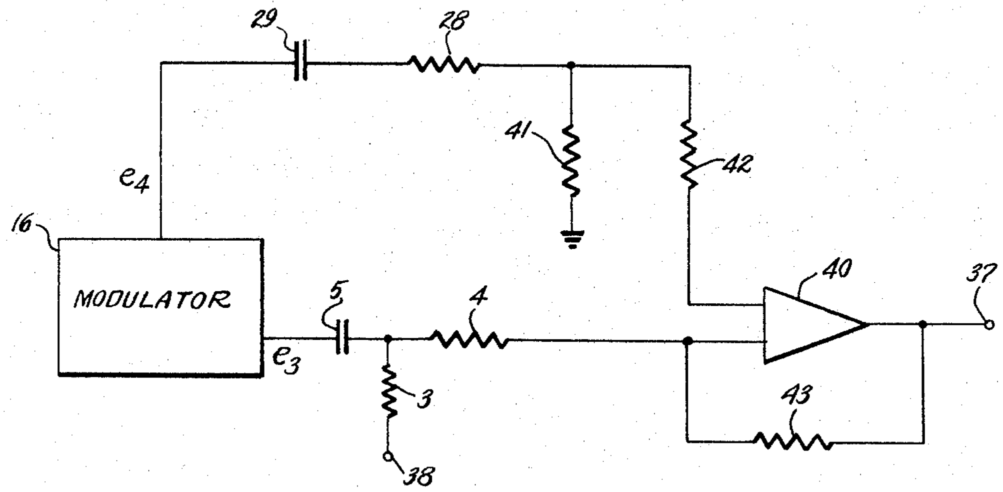
FIG. 3 is a schematic diagram of a second embodiment of the invention.

FIG. 3 shows a further embodiment of an oscillator system incorporating a distortion reducing circuit in accordance with the invention. In FIG. 3, modulator 16, capacitors 5 and 29, and resistors 3, 4 and 28 are the same as shown in FIG. 2. The distortion reducing portion of the apparatus includes a series resistor 42 interconnecting resistor 28 and one input of a differential amplifier 40. Amplifier 40 is a high gain amplifier having high impedance differential input terminals to which two signals can be applied, the signals being combined so that the output is representative of the algebraic difference between the input signals. Amplifiers of this general type are well known in the art, one discussion of such, amplifiers being available in the text "Electronic Analog Computers," second edition, By Korn and Korn. A signal developing resistor 41 is connected between ground and the junction between resistors 28 and 42.

Resistor 4, which couples the signal from modulator 16, is connected to the other input of differential amplifier 40, a feedback resistor 43 being connected between that input and the output terminal of amplifier 40. The output of amplifier 40 is connected to output terminal 37, as in FIG. 2, which is connected to the remaining oscillator amplifier stages.

The operation of the circuit of FIG. 3 is similar to that in FIG. 2 in that ripple voltage $e_3$ is coupled through capacitor 5 and resistor 4 to one input terminal of amplifier 40. Ripple voltage $e_4$, which is equal to $e_3$ is coupled through capacitor 29 and resistors 28 and 42 to the other input of amplifier 40. This differs from the circuit of FIG. 2 because in FIG. 2 the voltage was inverted by inverting operational amplifier 26. This inversion is rendered unnecessary in the circuit of FIG. 3 by the substitution of differential amplifier 40 for the simple operational amplifier 35 of FIG. 2. In FIG. 2, voltage $e_3$ and $e_7$ ($e_7$ being $e_4$ inverted) were summed at the input to ampjlifier 35. In the circuit of FIG. 3 voltage $e_4$ is not inverted but is differentially summed by differential amplifier 40, this modification being advantageous because an entire operational amplifier is eliminated at the cost of only a relatively slight increase in the complexity of the remaining amplifier. Thus, signals $e_3$ and $e_4$ are subtracted in amplifier 40, thereby substantially eliminating the undersired ripple component if the magnitudes of $e_3$ and $e_4$ are equal.

Referring to Equations 4 and 5, it will be seen that $e_4$ can be made equal to $e_3$ if (6) $$R_{28}+R_{41}=\frac{R_3R_4}{R_3+R_4}$$

It will be apparent that this equality can be established at any convenient set of values, and that it is independent of diode resistance.

While an advantageous embodiment has been chosen to illustrate the invention, it will be understood by those skilled in the art that various changes and modifications can be made therein without departing from the scope of the invention as defined in the appended claims.

What is claimed is:

1. An oscillator apparatus comprising the combination of an oscillator amplifier having an input terminal and an output terminal; regenerative feedback circuit means connected between the input and output terminals of said amplifier to provide regenerative feedback signals of proper phase and amplitude to sustain oscillations; frequency determining circuit means connected to said amplifier and said feedback circuit means to control the frequency of oscillations; control circuit means connected to said output terminal of said amplifier for producing a unidirectional pulsating control voltage signal proportional to the amplitude of the oscillations; variable impedance circuit means coupled to said feedback circuit means and to said control circuit means for accepting and responding to said control voltage signal to attenuate the signals provided by said feedback circuit means and to hold constant the amplitude of said oscillations; and distortion reducing circuit means coupled between said variable impedance circuit means and said amplifier input terminal for generating a pulsating unidirectional electrical signal to oppose pulsating distortion-producing signals delivered by said variable impedance circuit means to said amplifier input terminal.

2. An apparatus according to claim 1 wherein said control circuit means comprises rectifier circuit means for converting the oscillations appearing at said amplifier output terminal to unidirectional signals; a terminal to which a DC reference voltage can be supplied; and integrator circuit means connected to said terminal and to said rectifier circuit means for comparing said unidirectional signal to said reference voltage and for producing a relatively smooth pulsating unidirectional control voltage.

3. An apparatus according to claim 1 wherein said variable impedance circuit means comprises a second amplifier having an input terminal and an output terminal; a first plurality of unidirectionally conductive devices connected in series circuit relationship between said input and output terminals of said second amplifier to form a feedback circuit, all of said devices being poled in the same direction; and a second plurality of unidirectionally conductive devices connected in series circuit relationship between said output terminal of said second amplifier and a point of reference potential, all of said devices in said second plurality being poled in the same direction and in the direction opposite the devices of said first plurality relative to said second amplifier output terminal.

4. An apparatus according to claim 3 wherein said distortion reducing circuit means comprises a third amplifier having an input terminal and an output terminal; a capacitor and a resistor connected in series circuit relationship between said input terminal of said third amplifier and a point intermediate the ends of the series circuit formed by said first plurality of unidirectionally conductive devices in said variable impedance circuit means; a feedback resistor connected between said input and output terminals of said third amplifier; a circuit means interconnecting said output terminal of said third amplifier and said input terminal of said oscillator amplifier.

5. An apparatus for generating an electrical AC signal having controlled amplitude characteristics comprising the combination of oscillator circuit means including a first amplifier and regenerative feedback circuit means connected across said first amplifier; variable impedance circuit means including a second amplifier, a feedback circuit including an even number of diodes connected across said amplifier and a series circuit including a plurality of diodes equal in number to the diodes in said feedback circuit connected between the output of said amplifier and a point of reference potential; coupling circuit means for interconnecting said regenerative feedback circuit means and the midpoint of said series circuit of said variable impedance circuit means; and distortion reducing network means including an operational amplifier and a blocking capacitor connected in series circuit relationship with said operational amplifier, said distortion reducing network means being connected between an intermediate point in said feedback circuit of said variable impedance circuit means and an input to said first amplifier.

6. An apparatus for generating an electrical AC signal having controlled amplitude characteristics comprising the combination of oscillator circuit means including a first amplifier and regenerative feedback circuit means connected across said first amplifier; variable impedance circuit means including a second amplifier, a feedback circuit including an even number of diodes connected across said amplifier and a series circuit including a plurality of diodes equal in number to the diodes in said feedback circuit connected between the output of said amplifier and a point of reference potential; coupling circuit means for interconnecting said regenerative feedback circuit means and the midpoint of said series circuit of said variable impedance circuit means; and distortion reducing network means connected between an intermediate point in said feedback circuit of said variable impedance circuit means and an input to said first amplifier.

7. An apparatus according to claim 6 wherein said first amplifier comprises a differential input stage capable of accepting two input signals and producing an output signal representative of the algebraic difference between the two input signals, and said distortion reducing network means comprises a resistor and a capacitor connected in series circuit relationship between said feedback circuit of said variable impedance circuit means and said first amplifier to provide a first input, said coupling circuit means being operative to provide the second input.

8. An apparatus according to claim 6 wherein said regenerative feedback circuit means comprises first and second resistors connected in series circuit relationship said resistors having values $R_1$ and $R_2$ respectively; and said distortion reducing network means comprises a third resistor having a value $R_3$ connected between said feedback circuit of said variable impedance circuit means and said first amplifier, and a fourth resistor having a value $R_4$ connected between one terminal of said third resistor and a point of reference potential.

9. Apparatus according to claim 8 wherein the values of said first, second, third and fourth resistors are in the relationship $$R_3+R_4=\frac{R_1R_2}{R_3+R_4}$$

No references cited.

ROY LAKE, *Primary Examiner.*

S. H. GRIMM, *Assistant Examiner.*

Disclaimer and Dedication 3,378,791.—*Walter T. Towner*, Canton, Mass. OSCILLATOR WITH LOW DISTORTION FEEDBACK GAIN CONTROL. Patent dated Apr. 16, 1968. Disclaimer and dedication filed Mar. 17, 1971, by the assignee, *Weston Instruments, Inc.*

Hereby enters this disclaimer to the remaining term of said patent and dedicates said patent to the Public.

[*Official Gazette April 27, 1971.*]